United States Patent
Hania

(10) Patent No.: US 8,787,031 B2
(45) Date of Patent: Jul. 22, 2014

(54) CASING COMPRISING A RE-RECORDABLE COMPUTER MEDIUM TO BE FIXED IN A SERVICE CABINET

(75) Inventor: Binhas R. Hania, Maisons Alfort (FR)

(73) Assignee: Keter Technologies Europe, Paris (FR)

( * ) Notice: Subject to any disclaimer, the term of this patent is extended or adjusted under 35 U.S.C. 154(b) by 411 days.

(21) Appl. No.: 12/450,353

(22) PCT Filed: Mar. 18, 2008

(86) PCT No.: PCT/FR2008/000353
§ 371 (c)(1),
(2), (4) Date: Jan. 27, 2010

(87) PCT Pub. No.: WO2008/129179
PCT Pub. Date: Oct. 30, 2008

(65) Prior Publication Data
US 2010/0133968 A1  Jun. 3, 2010

(30) Foreign Application Priority Data

Mar. 23, 2007 (FR) ...................................... 07 02145
Oct. 24, 2007 (FR) ...................................... 07 07446

(51) Int. Cl.
*H05K 7/14* (2006.01)

(52) U.S. Cl.
USPC ........................................ 361/799; 361/800

(58) Field of Classification Search
USPC ................. 361/799, 785, 796, 800–802, 807
See application file for complete search history.

(56) References Cited

U.S. PATENT DOCUMENTS

| | | | | |
|---|---|---|---|---|
| 5,923,531 A * | 7/1999 | Bachman et al. | ............ | 361/690 |
| 6,831,831 B2 * | 12/2004 | Bicknell et al. | .......... | 361/679.33 |
| 7,583,510 B2 * | 9/2009 | Wang | ............................ | 361/753 |
| 2003/0043547 A1 * | 3/2003 | Nealis | ............................ | 361/704 |
| 2005/0036285 A1 * | 2/2005 | Lee et al. | ........................ | 361/683 |
| 2005/0110481 A1 * | 5/2005 | Dudley | .......................... | 324/156 |
| 2006/0041394 A1 * | 2/2006 | Kuwayama et al. | ............ | 702/57 |
| 2006/0294272 A1 * | 12/2006 | Chou et al. | ........................ | 710/62 |
| 2008/0195614 A1 * | 8/2008 | Lutz et al. | .......................... | 707/7 |
| 2008/0282859 A2 * | 11/2008 | Causse et al. | .................. | 83/76.3 |

* cited by examiner

*Primary Examiner* — Tremesha S Willis
(74) *Attorney, Agent, or Firm* — Edwards Wildman Palmer LLP; Scott D. Wofsy; Adam P. Daniels

(57) ABSTRACT

The invention relates to a case 1 intended to be fixed in an electrical cabinet, said case comprising a frontal opening which can be closed by a means of closing 3, and further comprising means of fastening 5 making it possible to fix said case 1 in said electrical cabinet, in particular on a metal rail, and said case 1 further comprising (a) at least one anti-magnetic and/or anti-static protective means 4, (b) a re-writeable medium 2, 21 for storing computer data, which is protected by said anti-magnetic and/or anti-static protective means 4.

12 Claims, 2 Drawing Sheets

Vue suivant B

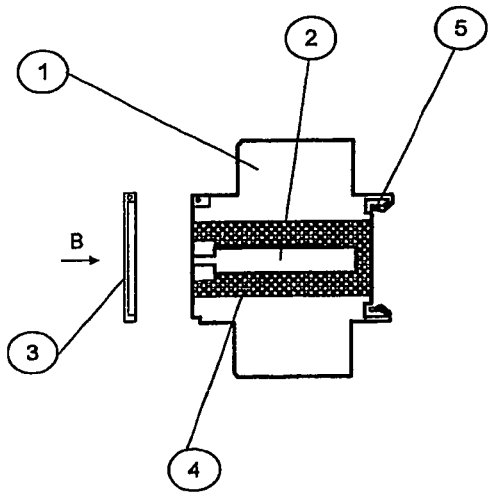
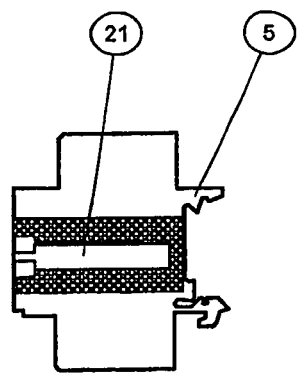
Figure 1  Figure 2
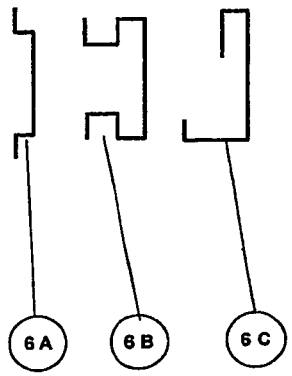
Figure 3
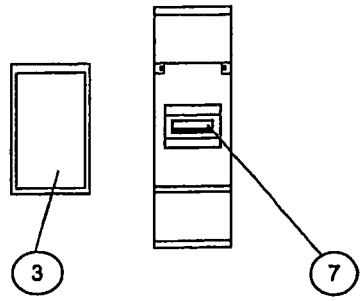
Vue suivant B
Figure 4
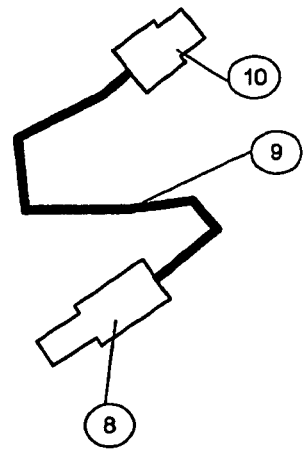
Figure 5

CASING COMPRISING A RE-RECORDABLE COMPUTER MEDIUM TO BE FIXED IN A SERVICE CABINET

CROSS-REFERENCE TO RELATED APPLICATIONS

The present application is a U.S. national phase, pursuant to 35 U.S.C. §371, of PCT international application No. PCT/FR2008/000353 filed on Mar. 18, 2008, and published in French as WO 2008/129179A3 on Oct. 30, 2008, which claims priority to a French Patent Application No. 0702145 filed on Mar. 23, 2007 and a French Patent Application No. 0707446 filed on Oct. 24, 2007, the content of which is herein incorporated by reference.

BACKGROUND OF THE INVENTION

1. Technical Field of the Invention

This invention relates to a case or compartment containing a re-writeable computer data storage medium, such as a flash memory, and provided with an anti-magnetic and/or anti-electrostatic protection, said case being able to be fixed in a box or a technical cabinet and in particular a box or an electrical cabinet, in order to store technical information pertaining to the installation served by said technical cabinet.

2. Description of Related Art

The persons who intervene in the technical boxes or technical cabinets (these two terms being used here indifferently) in order to repair, fix or modify the components and equipment present in this technical box or technical cabinet or in the installation served by the technical cabinet must have available the required technical information pertaining to the equipment of the cabinet, the components used and their arrangement, and must also have diagrams that describe the technical installation served by said cabinet, so that this intervention can be carried out effectively and rapidly and in accordance with the applicable technical standards, and in good conditions of safety. In the case of electrical cabinets or distribution cabinets, this technical information includes in particular the electrical diagrams of the circuits served by said cabinet, and the exact description of the electronic and electro-technical components: contactors, circuit breakers, differential circuit breakers, fuse carriers, fuses, load-shedding devices etc. With gas installations, this information pertains to the identification of the conduits, their flow, their pressure, the nature and purity of the gases etc.

According to prior art, this technical information, for example the electrical diagrams or mounting diagrams, typically has the form of documents on a paper medium, which can be written, drawn or printed, on separate or bound sheets, and for installations of substantial complexity, in the form of technical manuals. All of these documents as a whole are herein referred to as the "technical documentation". This technical documentation can include one or several fascicles, notebooks, binders or manuals. It is usually stored in a steel sheet or plastic compartment which is arranged on the inside of the door of said cabinet. Such a device is described for example in patent application DE 2 503 527 (Rittal Werke). Documents comprising a low number of sheets can also be positioned in a transparent plastic pouch fixed to the inside of the door or to another appropriate location inside or outside of the technical cabinet.

It is important that this technical documentation remain available and legible throughout the entire duration of use of said installation, as it is difficult, long and dangerous to intervene on an installation of which the diagram and the technical description of the components are not known. Even if a copy of this technical documentation does exist somewhere, with the original installer or with the owner of the building where the installation is located, the immediate availability of the technical documentation in the technical cabinet itself, or in the vicinity of the latter is indispensable, and this not only for emergency interventions.

The loss of the technical documentation can have several causes: the installer intervening on the installation can forget to put it back in place, or a person not authorised to intervene in the cabinet can remove it, for any reason whatsoever. Moreover, even if the technical documentation is put back in place after consultation, its paper medium cannot be long-lasting: it can absorb humidity and dust, it can be eaten away by mice or insects, it can be dirtied or damaged when it is being consulted. Over the years and even decades, the technical documentation can as such become illegible.

This problem can be aggravated in the case of technical cabinets in an industrial environment, where the dust, gaseous emanations, humidity, differences in temperature, vibrations and other outside influences can result in an accelerated aging of the paper medium of the technical documentation. Moreover it is in an industrial environment where this technical documentation risks to be consulted more often than in a residential environment, and where the interventions on the technical installation served by the technical cabinet are particularly urgent.

PROBLEMS TO RESOLVE

The problem that this invention aims to resolve is to present a method of sustainable storage for the technical documentation of a technical cabinet, which avoids the paper medium, thus preventing the loss or the theft of the documentation, and which is easy to use for the qualified personnel authorised to intervene in the technical cabinet.

Another problem is that of updating the technical documentation in the case of a modification of the installation. The documentation on paper can be modified only by replacing the sheets that it is comprised of, or via annotations made to said sheets. The first option supposes that the technician has the computer file that contains the contents of said documentation, as well as a means of printing. The second option can result in inscriptions that are hardly legible or hardly durable, and in the case of complex diagrams, or successive modifications, these modified diagrams risk becoming progressively illegible.

SUMMARY OF THE INVENTION

A first object of this invention is a case 1 for the saving of technical information by a user, said case being intended to be fixed in a technical cabinet, and in particular intended to be fixed on a metal rail 6, said case 1 comprising a frontal opening which can be closed by a means of closing 3, such as a lid or a cover, and further comprising means of fastening 5 making it possible to fix said case 1 in said electrical cabinet, and advantageously on said metal rail 6, and said case 1 being characterised in that it further comprises (a) at least one anti-magnetic and/or anti-static protective means 4, and (b) a re-writeable medium 2, 21 for the storage of computer data, said storage medium 2, 21 being removable or, more preferably, fixed, and being protected by said anti-magnetic and/or anti-static protective means 4.

Another object of this invention is the use of said computer medium 2, 21 contained in a case 1 according to the invention for the recording of plans or technical information describing the installation pertaining to the technical cabinet wherein said case is installed.

Another object of this invention is a method for updating technical information describing the technical installation relating to a technical cabinet wherein is installed a case 1 according to the invention, said method comprising the following steps:

i) said means of closing 3 are opened, ii) a first socket 8 of a cable 9 connected or to be connected by a second socket 10 is connected to a computer on the socket 7 of said re-writeable medium 2 and in particular of said USB key 21, (iii) information is transferred from the computer to said re-writeable medium 2 and in particular to said USB key 21 and/or information is transferred from said re-writeable medium 2 and in particular from said USB key 21 to said computer, iv) said first socket 8 of the cable 9 is disconnected from the socket 7 of said re-writeable medium 2 and in particular of said USB key 21, (v) said means of closing 3 are closed.

DESCRIPTION OF THE FIGURES

FIGS. 1 to 4, 6 and 7 show embodiments of this invention.

FIG. 1 shows a cross-section of a case 1 according to the invention.

FIG. 2 shows a cross-section of another case 1 according to the invention, which has mounting lugs 5 of a different form.

FIG. 3 shows three types of rails 6A, 6B, 6C according to prior art wherein the case 1 according to the invention can be mounted.

FIG. 4 shows a frontal view (view according to B as shown in FIG. 1) of a case 1 according to the invention.

FIG. 5 shows a cable 9 of the common type making it possible to connect the USB key 21 to a portable computer, by using two sockets 8, 10.

FIG. 6 shows a cross-section of another case 1 according to the invention. Note the presence of a rear hold-down bolt 25 which cooperates with the threaded hole 27 in the case, able to firmly fix the case 1 on the rail 6.

FIG. 7b shows a frontal view (view according to B as indicated in FIG. 1 or 6) of a case 1 according to a particular embodiment, which comprises a display screen 34, a keyboard 33 and LEDs 32. This case can comprise (FIG. 7a) a protective cover 31.

Figure 6:
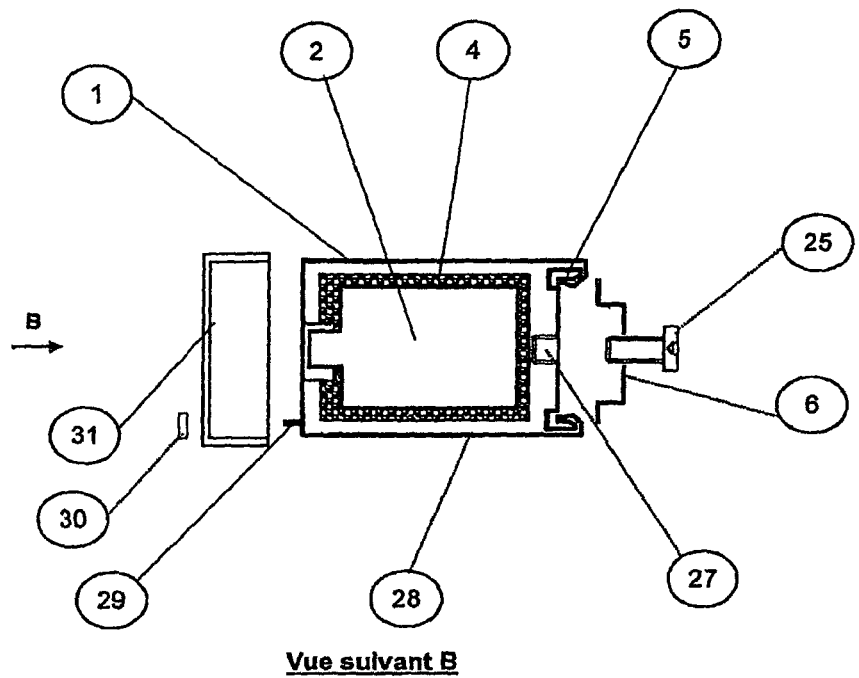
Figure 7:
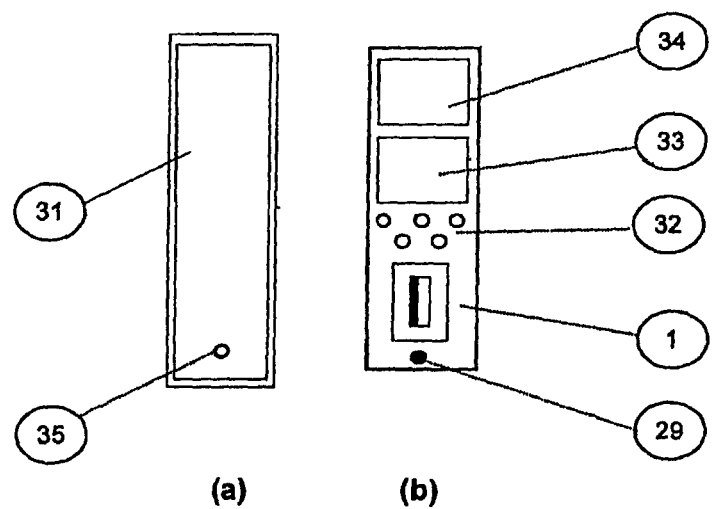

The following marks are used:

| Case | 1 |
|---|---|
| Re-writeable computer data storage medium | 2 |
| Protective lid | 3 |
| Anti-magnetic and/or anti-static protective device | 4 |
| Means of fastening | 5 |
| Fastening rail | 6, 6A, 6B, 6C |
| USB key socket | 7 |
| Socket for USB key | 8 |
| Connecting cable | 9 |
| Socket for USB output of the computer | 10 |
| USB memory key | 21 |
| Rear hold-down bolt | 25 |
| Threading making it possible to lock the rear hold-down bolt on the fastening rail | 27 |
| Polymer resin | 28 |
| Front locking screw | 29 |
| Front means of locking that can be sealed | 30 |
| Protective cover | 31 |
| Means of displaying (LEDs) | 32 |
| Keyboard | 33 |
| Means of displaying (screen) | 34 |
| Hole for passing the front means of locking | 35 |

DETAILED DESCRIPTION OF THE INVENTION

The problem is resolved according to the invention by a case provided with means of anti-static and/or anti-magnetic protection 4, which can be installed on the standardised rails 6, 6A, 6B, 6C whereon, are usually installed the cases containing electrical components in an electrical cabinet or in an electrical board. The case according to the invention comprises a fixed or removable computer medium 2, more preferably re-writeable, such as a memory of the flash type, and more preferably a memory of the USB key type 21. This computer medium can contain one or several computer files which contain the technical documentation of the technical installation served by the cabinet.

The case 1 according to the invention can have the same outside form (i.e. height, width, depth, and possibly contours of the front face) as a standardised case used to contain electro-technical components. This embodiment is preferred, because for the manufacture of the case 1 according to the invention, the moulds which are used in the manufacture of standard cases can as such be used, knowing that the price of a mould intended for forming plastic materials is a major factor of cost for the manufacturer of said cases.

As such the case 1 according to the invention can be a case that has the same outside form as a standard case used for example for a circuit-breaker, a fuse carrier, a cut-off switch, a switch (such as a cut-off switch or a differential switch), a contactor (such as a day/night contactor), a slave switch, a circuit breaker (such as a disconnecting circuit breaker or a differential circuit breaker), a remote control switch, a relay, an automatic device, a regulator, a beginning and/or end of travel contact, a timer, a lighting system, or this can be a case containing a device selected from the group consisting of: a circuit-breaker, a fuse carrier, a cut-off switch, a switch, a cut-off switch, a differential switch, a contactor, a day/night contactor, a slave switch, a circuit breaker, a disconnecting circuit breaker, a differential circuit breaker, a remote control switch, a relay, an automatic device, a regulator, a beginning and/or end of travel contact, a timer, a lighting system, a clock, a scheduling system, a lighted indicator, a pushbutton, a single or multiple-position switch. Indeed, in a particular embodiment of this invention, the re-writeable medium for storing computer data 2, 21 is integrated into a common type case which already contains one of the mentioned electro-technical components, subject to the condition that there is enough space for said re-writeable medium for storing computer data 2, 21 and its anti-magnetic and/or anti-static and/or anti-electromagnetic protective means 4, and subject to the condition that said case has a means of closing 3 which allows for easy access to said medium 2, 21.

Such standard cases are described for example in the German utility model DE 20 2005 009 123 U1 (Dehn+Sohne GmbH+Co.) and in the French patent application FR 2 689 332 (General Electric Company).

A case 1 according to the invention typically has two lateral parallel and flat faces, and a rear face perpendicular to the two lateral faces, said rear face able to comprise the means of fastening making it possible to fix the case 1 on a metal rail 6 of a standardised type. The case 1 according to the invention comprises a means of closing 3, such as a lid or cover, which is either totally removable, or which can be folded back or opened while still remaining fixed to the case. In an embodiment, the case 1 according to the invention is a common model circuit-breaker case, with a pivoting opening. In other embodiments, the case 1 has the form of a cube or of a parallelepiped, the means of closing 3 being a lid fixed by a horizontal side or by a vertical side.

Advantageously, the means of closing 3, and in particular the lid or cover, is located on the front face of the case 1 such as it appears to the user when the case 1 is mounted on the rail 6. The means of closing 3 can be fixed on the case 1 by any appropriate means, for example by snapping on. It can be protected by sealing (using a means of sealing 29, which can be a sealable screw) or by a key-operated lock or any other means of protection. It can be transparent or opaque.

The case 1 according to the invention can be provided with a specific or additional protection against dust and/or humidity, such as a flap, more preferably transparent, which covers at least the front face of said case, and which advantageously comprises an elastic seal.

The case 1 according to the invention can advantageously comprise a threaded hole 27 on the rear which cooperates with a hold-down bolt 25 introduced at the rear through a hole made in the rail 6. As such, the case is prevented from being removed from the rail without unscrewing, beforehand and from the rear of the rail, the release bolt; this is an anti-theft function.

The case 1 can be manufactured from any material that is acceptable for the intended application, for example from polymer resin 28; it must comply with the regulations and with the standards that apply, that those skilled in the art know well, and in particular with the regulations relating to Public Assembly Buildings and High-Rise Buildings. As such, it must comply with the NF EN 60 695-2-11 standard, and must satisfy the standards relating to the self-extinguishing capacity (incandescent wire test at 750.degree. C.). Acceptable materials are in particular: natural rubber, ethylene propylene rubber (EPR), polyvinyl chloride (PVC), cross-linked polyethylene (PEX), polychloroprene (PCP), polyamide. Advantageously, the case is designed and carried out in such a way as to also resist the liquid and solid body penetration test, such as specified by the NF EN 60 529 standard (IP class 65 or better), and mechanical impacts, such as specified by the NF EN 50 102 standard (IK class or better). In an embodiment, a composite polymer resin is used, which can contain conductive fillers.

The case 1 comprises means of fastening 5, such as mounting lugs and/or rails, that cooperate with the metal fastening rail 6, 6A, 6B, 6C whereon said means of fastening 5 are intended to be fixed, and which usually is provided on electrical cabinets and boxes. This rail 6 is usually an aluminium or steel profiled rail. Methods of fastening the case 1 according to the invention are in particular: snapping onto a metal rail using two fasteners that can be clipped, snapping onto a profile of the hat type or an asymmetric profile or a combined profile, the mounting on a U-shaped perforated riser, the snapping onto symmetric bar, the mounting or snapping onto a perforated grid, the mounting on a chassis, the mounting on a solid plate (perforated for cabinet or perforated for box), the mounting on a magnetic base, the mounting and fastening direct by protrusion, the mounting in an adaptation case for mounting as a protrusion, the mounting on the front face of a technical cabinet, the mounting off of the electrical board outside under a shelter.

All of these embodiments do not require the intervention of a rail 6, and the means of fastening 5 can be means that do not cooperate with a rail 6.

The case 1 according to the invention comprises means of anti-magnetic and/or anti-static and/or anti-electromagnetic protection 4, which surround at least partially the re-writeable computer data storage medium 2, 21. This protection is required if the case 1 is intended to be used in the cabinets wherein high electric current flows, of a magnitude of 10 A or more, but it is prudent to use it in all cases, in any environment, in order to guarantee the integrity of the computer data over a long period of time. Electrical circuit breaker switches are known comprising memories of the EEPROM type without any protection against electromagnetic interference (see U.S. Pat. No. 4,958,252).

The means of anti-magnetic and/or anti-static protection 4 used in the case according to the invention can have different forms. By way of example, the case 1 can be manufactured from anti-magnetic and/or anti-static material, or include an anti-magnetic and anti-static protective device. In certain cases, it may be sufficient to provide only a metal wall of significant dimension.

In a first embodiment, the case 1 according to the invention, if it is provided to be used in an electrical cabinet, is advantageously made of conductive material, and more particularly of anti-magnetic and/or anti-static material. This anti-magnetic and/or anti-static material can constitute the earth of the material of the case, or the case can comprise an anti-magnetic coating, said anti-magnetic coating able to be located on the external surfaces or on the internal surfaces of said case, or on both at the same time, or on only a portion of said surfaces. In an embodiment, a composite polymer resin is used containing conductive fillers.

In another embodiment, the case 1 according to the invention can contain a protective anti-magnetic and/or anti-static device, such as a small metal box, or an envelope having the effect of a wire netting Faraday cage, made of metal wire, or of plastic provided with a conductive coating of sufficient thickness and conductivity.

The re-writeable computer data storage medium 2, 21 can also be fixed in the case using a glue or paste loaded with conductive fillers which at least partially surrounds said computer medium.

These different embodiments can also be combined.

The computer data storage medium that is particularly preferred within the framework of this invention is a flash memory, for example a memory of the RAM type (Random Access Memory) or a memory of the RWM type (Read-Write Memory), or a memory of the EEPROM type (Electrically Erasable Programmable Read Only Memory). A particularly preferred embodiment uses the device known under the denomination "USB key" 21. In this denomination, USB means Universal Serial Bus, a connection technology which simplifies the linking of peripheral devices, and which is particularly adapted to slow peripheral devices. The USB key has many advantages, especially if the so-called "hot-plug" technology is adopted: it can be configured in such a way as to be automatically recognised by the operating system of the computer that must read it (function called "Plug & Play"), it can be disconnected "hot", i.e. without turning off the computer, and it does not need any auxiliary power, with the electric current being provided by the USB bus of the computer. Moreover, the USB key is a re-writeable computer data storage medium, i.e. it is easy to modify the stored information, or add more information to it. A USB key comprises a USB socket 7 via which can be connected, by the intermediary of a connecting cable 9 provided with a socket 8 that cooperates with that 7 of the USB key, to a computer.

In an advantageous embodiment, the flash memory, and in particular the USB key 21 is fixed in the case 1 permanently. The flash memory and in particular the USB key 21 can be fixed in the case 1 or in the means of closing 3 (for example in the lid) by any appropriate means, for example by gluing, or by injecting a plastic material or a similar component around the key. The USE socket 7 must remain accessible after the opening of said means of closing 3, in such a way as to be able to connect a cable to said socket 7.

In another embodiment, the case 1 comprises a memory of the ROM (Read-Only Memory) type, programmed or used in such a way as to allow for the stacking of new information, without being able to erase the old information.

In yet another embodiment, the case 1 comprises a plurality of computer data storage mediums of different types, for example a flash memory and a memory of the ROM type. This ROM memory can be used or programmed in such a way as to allow for the stacking of new information, without being able to erase the old information.

In an advantageous embodiment, the case 1 according to the invention further comprises a means of teletransmitting computer data stored on the re-writeable computer medium. This means of teletransmission must be able to transmit the data from the re-writeable data storage medium 2, 21 to a user. It must comprise a source of energy, typically an electric battery, or electrical power, for example of the 220V or 48V or 24V type. Said means of teletransmission can be for example an optical means of teletransmission, in particular via infrared beam, or a means of teletransmission via Hertzian waves. In the case of a means of teletransmission via Hertzian waves, this means advantageously comprises an antenna. This antenna can for example be silk-screened or printed on the external or internal surface of the case 1. In addition, or alternatively, the case 1 can include an appropriate connector for the connection to a computer network.

The case 1 according to the invention can be installed in any type of electrical cabinet, existing or newly installed, located in residential premises, individual homes, flats, industrial premises, commercial premises, hospitals, warehouses, technical premises, computer rooms, public assembly buildings, high-rise buildings, factories, or outside, for example in construction site electrical boxes. The case according to the invention can also be installed in on-board electrical cabinets, i.e. onboard trains, aircraft, boats, mobile electric generating sets, motorised agricultural vehicles, military systems and vehicles (such as: tanks, submarines), private cars, utility vehicles.

The case 1 according to the invention can also be installed in road traffic lights, terminals (such as information terminals or road sign terminals), posts (such as sign posts or road traffic light posts), time-date stampers (such as electronic time-date stampers), vending machines. It can also be installed on a dashboard of utility vehicles, private cars, agricultural vehicles, military vehicles (tanks, troop transport vehicles).

This is in particular (but not exclusively) in this case the incorporation into a vehicle dashboard such as listed hereinabove in that the case 1 is not necessarily fixed on a metal rail 6, but can comprise means of fastening 5 allowing for another method of fastening, such as gluing, snapping, clipping. In a particular embodiment, the case comprises on the one hand a ROM memory with a connection of the USB type connected to the computer of the vehicle by a specific connector which can be a connection of the CAN type, and on the other hand, a flash memory with a connection of the USB type. In the ROM memory, the maintenance technician (garageman) enters the information pertaining to the maintenance, such as the maintenance programmes for the vehicle, while the information pertaining to the date and the time of the maintenance are automatically entered via the link from the ROM memory module to the computer of the car or of the vehicle. Likewise, the on-board computer of the vehicle can record the kilometers traveled, for example each thousand or each hundred kilometers. As such, there cannot be any cheating when the vehicle is sold, as the information entered in the ROM memory can no longer be modified without destroying it. In this embodiment, the memory of the flash type can contain for example the documentation for the car, the maintenance booklet, the kilometrage follow-up spreadsheets, various equipment information; this information can be updated by the maintenance technician or by the user of the vehicle.

In a particular embodiment, the case 1 according to the invention can contain a plurality of re-writeable computer data storage mediums 2. It is also possible to install a plurality of cases 1 according to the invention in the same technical cabinet, more preferably in different locations, exposed in a different way to the electrical and/or magnetic fields that may be present in the technical cabinet. As such, an additional copy of the files can be retained.

The use of a USB key 21 as re-writeable computer data storage medium 2 is particularly advantageous. As such, the case 1 according to the invention is compatible with all computers equipped with a USB port and with a USB flash drive module of the Plug and Play type. A 4-pin USB socket of the A type is used and an interface compatible with the 1.times. Hi-speed USB 2.0 and USB 1.1 systems. Advantageously, the re-writeable computer data storage medium is compatible with the Windows®. Vista/XP/2000/ME operating systems.

The read transfer rate is advantageously at least 18 Mb/s, the write transfer rate advantageously at least 11.5 Mb/s.

The capacity of the flash memory of the USB key 21 is typically between 256 Mb and 4096 Mb, and advantageously at least 1 Gb. Such a re-writeable computer data storage medium 2 offers, among the existing technologies, a maximum number of read/write cycles.

In an embodiment, the memory space of the re-writeable computer data storage medium 2 is partitioned with a user password. The entire computer data storage medium 2 can also be protected by at least one password that the user must enter so that the connection can be established.

In an advantageous embodiment, the re-writeable computer data storage medium 2 is configured in such a way as to include at least two different methods of access:

A first method of access only allows the user to read the data contained in this computer data storage medium 21. A password is optional for this first method of access. A second method of access allows the user to read and write the data contained in this computer data storage medium 21. In order to access this method of access, a password is required. The access to the computer data storage medium 21 can be accomplished by the intermediary of a network connection, for example via a network socket, which can be of the RJ45 type. This network socket is located advantageously on the front face of the case 1. The connection to the computer network can also be a wireless connection, by the intermediary of a means of teletransmission.

A third method of access can be provided, reserved for the manufacturer of the model or his agent, i.e. to a specially-authorised user, aiming to facilitate computer maintenance and allow access to all of the data without having to know the two passwords mentioned hereinabove.

In a particular embodiment, the user enters the password using a keyboard 33, typically of the numeric or alphanumeric type, which is located advantageously on the front face of the case 1. Optionally, the case can also include one or several means of display, for example a display screen 34 or one or several lighted indicators 32, typically LEDs (Light Emitting Diodes). In this case, it is particularly advantageous to protect at least the keyboard 33 by a protective cover 31. The keyboard 33 can also be integrated into the display screen 34, which is then a touch screen.

The re-writeable computer data storage medium 2 can also be connected to a computer network by the intermediary of an appropriate connector, such as a connector of the RJ45 type.

The invention has many advantages. The case 1 according to the invention allows the user to store in a durable fashion a re-writeable computer data storage medium 2, in particular a flash memory, and more particularly a USB key 21. It can be fixed on the same metal rails 6, 6A, 6B, 6C as the cases comprising electrical components in the electrical cabinets. Thanks to the case 1 according to the invention, the technical documentation of the installation can easily be read by the user (typically a maintenance technician) who is intervening in the technical cabinet. The user (technician) can also modify the technical documentation, by updating the computer file stored on the computer data storage medium 2, in order to incorporate therein the modifications that he has just made to the installation. He can also store on this medium 2 an intervention report or any other information that is desirable to retain and keep available for the technicians who intervene in this electrical cabinet. The use of a USB key as a re-writeable computer medium is particularly advantageous. Its operating ranges in terms of temperature (0.degree. C. to 70.degree. C.) and in terms of hygrometry (25 to 95%) are particularly vast, and the generation of heat by the electronic components is minimal.

EXAMPLE

A case according to the invention has been carried out provided with a fastening using screws onto a standardised rail, protected against dust and splashing. The re-writeable computer data storage medium was a flash memory of the Nand Flash Multi Level Cell type, with a capacity, according to the model, of 256 Mb to 4096 Mb. A USB 1.1-compatible interface, an interface of the USB 2.0 1× Hi-Speed 4-pin A type or a specific PDA-compatible connector was used. The read transfer rate was 18 Mb/s, and the write transfer rate 11.5 Mb/s.

What is claimed is:

1. A case for saving technical information by a user and intended to be fixed in a technical cabinet, and in particular intended to be fixed on a metal rail, said case comprising: a front side including a frontal opening and a means for closing that can be folded back while remaining fixed to the case, said means for closing making it possible to close said frontal opening; at least two opposed mounting lugs extending from a rear side of the case and projecting in a direction that is perpendicular to the rear side of the case, the at least two opposed mounting lugs configured and adapted for releasably fastening said case to a corresponding mating configuration of the metal rail in said technical cabinet on said metal rail; at least one of an anti-magnetic and an anti-static protective means; and a re-writeable flash type medium for storing computer data, said flash type medium being fixed, and being protected by at least one of said anti-magnetic and anti-static protective means, as well as by said means of closing, said re-writeable flash type medium for storing computer data is accessed via said front opening of said case, wherein said re-writeable flash type medium is a memory of a USB key type comprising a USB socket characterized in that the USB key type memory is fixed in the case or in its means of closing, in such a way that its USB socket is accessible after the opening of said means of closing, in such a way as to be able to connect a cable to said socket.

2. The case as set forth in claim 1, wherein said means of closing is a cover or a lid.

3. The case as set forth in claim 2, characterized in that it further comprises: a means of teletransmission able to transmit data from the re-writeable flash type medium to at least one of a user and an appropriate connector for connection to a computer network.

4. The case as set forth in claim 1, characterized in that the at least one of the anti-magnetic and the anti-static protective means is selected from the group consisting of: conductive coatings applied to at least one portion of an external surface or an internal surface of said case, a metal box, a plastic case coated with a conductive coating, at least one metal wall, a wire and/or wire netting Faraday cage, a glue or paste loaded with conductive fillers which surround at least partially said re-writeable flash type medium.

5. The case as set forth in claim 4, characterized in that it is a case containing a device selected from the group consisting of: a circuit-breaker, a fuse carrier, a cut-off switch, a switch, a cut-off switch, a differential switch, a contactor, a day/night contactor, a slave switch, a circuit breaker, a disconnecting circuit breaker, a differential circuit breaker, a remote control switch, a relay, an automatic device, a regulator, a beginning and/or end of travel contact, a timer, a lighting system, a clock, a scheduling system, a lighted indicator, a pushbutton, a single or multiple-position switch.

6. The case as set forth in claim 1, characterized in that it further comprises a keyboard for entry of a password, and at least one or more means of display.

7. The case as set forth in claim 6, characterized in that it further comprises a memory of the ROM type, used or programmed in such a way as to allow for the stacking of new information, without erasing old information.

8. The case as set forth in claim 1, wherein the fixed re-writeable medium for storing computer data includes recording of plans or technical information describing the technical installation pertaining to the technical cabinet wherein said case is installed.

9. The case as set forth in claim 8, wherein the case is adapted for a technical installation located in residential premises, individual homes, flats, industrial premises, commercial premises, hospitals, warehouses, technical premises, computer rooms, public assembly buildings, high-rise buildings, factories, construction site electrical boxes, trains, aircraft, boats, mobile electric generating sets, motorized agricultural vehicles, military systems and vehicles, private cars, utility vehicles, sign posts, road sign terminals, road traffic light posts, information terminals, time-date stampers or vending machines.

10. A method for updating technical information describing a technical installation pertaining to a technical cabinet, said method comprising: opening a frontal opening on a front side of a case mounted to a metal rail of a technical cabinet by at least two opposed mounting lugs extending from a rear side of the case and projecting in a direction that is perpendicular to the rear side of the case, said frontal opening of the case including means of closing that can be folded back while remaining fixed to the case; connecting a first socket of a cable to a re-writeable medium of the case via said front opening, wherein the rewritable medium is a USB key type, the cable is configured to connect by a second socket to a computer or a computer network; transferring information between the computer or the computer network and said re-writeable medium; disconnecting said first socket of the cable from the socket of said re-writeable medium; and closing said means of closing associated with the case.

11. The method set forth in claim 10, wherein, before the transfer of information between the writeable medium and the computer or the computer network, at least one password is entered.

12. The case as set forth in claim 4, characterized in that it is a case containing a device selected from the group consisting of: a circuit-breaker, a fuse carrier, and a cut-off switch.

* * * * *